(12) United States Patent
Huang et al.

(10) Patent No.: US 7,094,638 B2
(45) Date of Patent: Aug. 22, 2006

(54) METHOD OF FORMING GATE STRUCTURE

(75) Inventors: Jin-Tau Huang, Tao-Yuan Hsien (TW); Chung-Peng Hao, Taipei Hsien (TW); Yi-Nan Chen, Taipei (TW); Tse-Yao Huang, Taipei (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 74 days.

(21) Appl. No.: 10/605,678

(22) Filed: Oct. 17, 2003

(65) Prior Publication Data

US 2005/0085025 A1    Apr. 21, 2005

(51) Int. Cl.
*H01L 21/336* (2006.01)
*H01L 21/8234* (2006.01)

(52) U.S. Cl. .................. 438/197; 438/739; 257/E21.17

(58) Field of Classification Search ................ 438/197, 438/737, 739, 742, 754, 755; 257/E21.176, 257/E21.177
See application file for complete search history.

(56) References Cited

U.S. PATENT DOCUMENTS

| | | | |
|---|---|---|---|
| 5,545,578 A * | 8/1996 | Park et al. ................... | 438/303 |
| 6,258,654 B1 * | 7/2001 | Gocho .......................... | 438/240 |
| 6,448,140 B1 * | 9/2002 | Liaw ........................... | 438/279 |
| 6,503,844 B1 * | 1/2003 | Curello ........................ | 438/710 |
| 6,521,963 B1 * | 2/2003 | Ota et al. .................... | 257/412 |

* cited by examiner

*Primary Examiner*—Caridad Everhart
(74) *Attorney, Agent, or Firm*—Winston Hsu

(57) ABSTRACT

A method of forming a gate structure. First, a substrate is provided, and a gate oxide layer, a polysilicon layer, a silicide layer, and a cap layer are consecutively formed onto the substrate. Then, an etching process is performed to etch a portion of the cap layer, the silicide layer, and the polysilicon layer and stop on the polysilicon layer for forming a stacked gate. Thereafter, a portion of the silicide layer exposed on sidewalls of the stacked gate is removed to form a recess. A passivation layer is deposited to fill the recess. The remaining polysilicon layer and the gate oxide layer outside the sidewalls of the stacked gate structure are removed.

6 Claims, 10 Drawing Sheets

METHOD OF FORMING GATE STRUCTURE

BACKGROUND OF INVENTION

1. Field of the Invention

The present invention relates to a method of forming a gate structure, and more specifically, to a method capable of avoiding word line/bit line short-circuiting.

2. Description of the Prior Art

Dynamic random access memory (DRAM) is composed of many memory cells, and each memory cell has a metal oxide semiconductor (MOS) transistor and a capacitor. The gate of the MOS transistor (also known as word line) serves as a switch of the MOS transistor, while the drain or the source is connected to a bit line for writing and erasing data.

Please refer and FIG. 1 and FIG. 2. FIG. 1 and FIG. 2 are schematic diagrams illustrating a conventional method of forming a gate structure. As shown in FIG. 1, primarily, a substrate 10 having at least a stacked gate structure 12 is provided. The stacked gate structure 12 from bottom to top comprises a gate oxide layer 14, a polysilicon layer 16, a silicide layer 18, and a cap layer 20.

Then as shown in FIG. 2, a chemical vapor deposition (CVD) process is performed to deposit a silicon nitride layer (not shown) onto the substrate 10. Following that, an anisotropic etching process is performed to remove a portion of the silicon nitride layer (not shown) to form a spacer 22 on the sidewalls of the stacked gate structure 12. Finally, an implantation process is performed to form a drain (not shown) and a source (not shown) in the substrate 10.

The conventional method further comprises the steps of forming a bit line after forming the stacked gate structure 12. Please refer to FIG. 3 to FIG. 5. FIG. 3 to FIG. 5 are schematic diagrams showing the steps of forming the bit line. As shown in FIG. 3, first a barrier layer 24 is deposited onto the substrate 10 and the stacked gate structure 12. Then a borophosphosilicate glass (BPSG) layer 26 is deposited on the barrier layer 24, and a flow process is performed for planarizing the BPSG layer 26. Finally a chemical mechanical polishing (CMP) process is performed to remove the BPSG layer 26 higher than the cap layer 20.

The material of the barrier layer 24 is silicon nitride, which is capable of preventing the ions of BPSG layer 26 from diffusing into the substrate 10 in the flow process.

As shown in FIG. 4, a dielectric layer 28, such as an oxide layer using TEOS as precursor, is deposited onto the stacked gate structure 12. Then a photo-etching process is performed to remove a portion of the dielectric layer 28, the BPSG layer 26, and the barrier layer 24 for forming a contact hole 30.

Finally as shown in FIG. 5, a bit line 32 is formed for electrically connecting to the drain or source (not shown) of the substrate 10 via the contact hole 30.

It can be seen from the above description that the conventional method utilizes the spacer 22 to avoid the word line (the polysilicon layer 16 and the silicide layer 18)/bit line short-circuit problem. However, as semiconductor device integrity increases and critical dimension decreases, the spacer 22 is apt to be destroyed in the step of forming the contact hole 30. As shown in FIG. 4, the bit line 32 and the silicide layer 18 will be short-circuited easily under this condition. Particularly, when critical dimension is under 0.11 µm, the short-circuit problem is not ignorable.

SUMMARY OF INVENTION

It is therefore a primary objective of the present invention to provide a method of forming a gate structure capable of solving the above-mentioned problem.

According to the claimed invention, a method of forming a gate structure is disclosed. First, a substrate is provided, and a gate oxide layer, a polysilicon layer, a silicide layer, and a cap layer are consecutively formed on the substrate. Following that, a portion of the cap layer, the silicide layer, and the polysilicon layer are etched for forming a stacked gate structure. Then, a portion of the silicide layer exposed on sidewalls of the stacked gate structure is removed to form a recess. Finally, a passivation layer is filled into the recess, and the polysilicon layer and the gate oxide layer outside the sidewalls of the stacked gate structure are removed.

The method of the present invention forms a recess on the sidewalls of the stacked gate structure and fills a passivation layer into the recess so that a word line/bit line short-circuit is avoided. In addition, since the polysilicon layer outside the sidewalls of the stacked gate structure is kept when forming the recess, the gate oxide layer will not be eroded by the etching solution when forming the recess.

These and other objects of the present invention will be apparent to those of ordinary skill in the art after having read the following detailed description of the preferred embodiment that is illustrated in the various figures and drawings.

DETAILED DESCRIPTION

Figure 1:
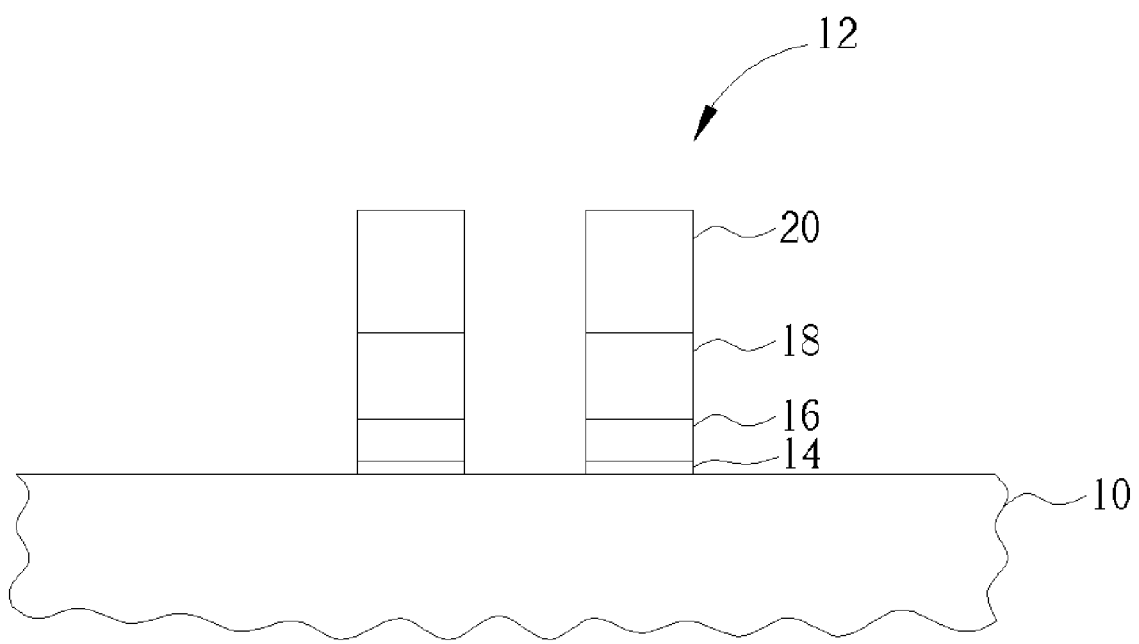
FIG. 1 and FIG. 2 are schematic diagrams showing a conventional method of forming a gate structure.
Figure 2:
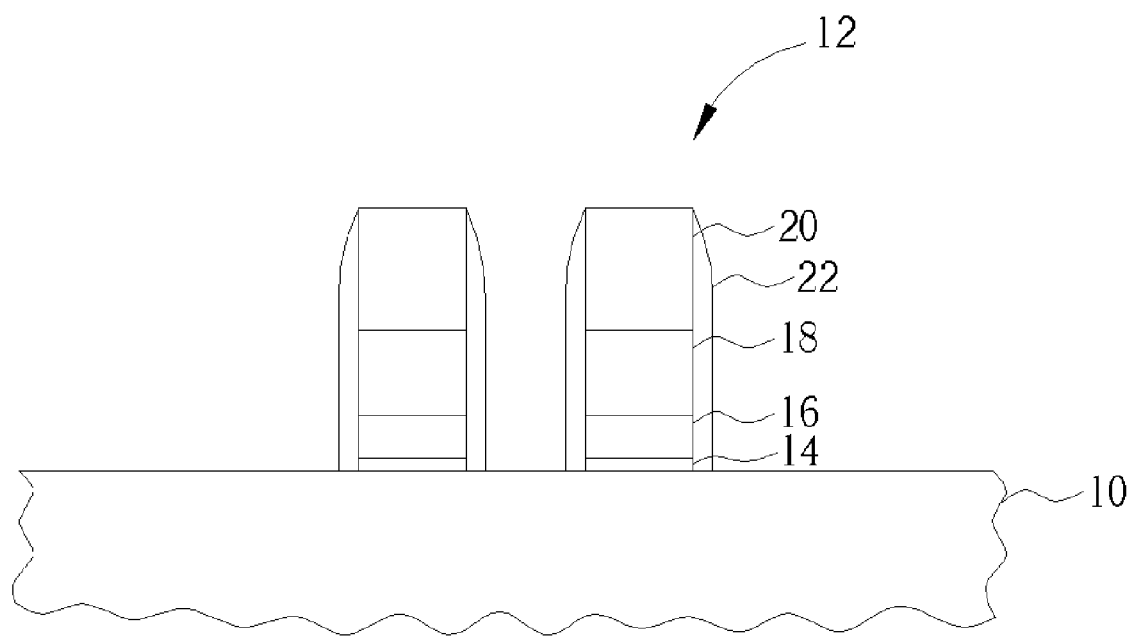
Figure 3:
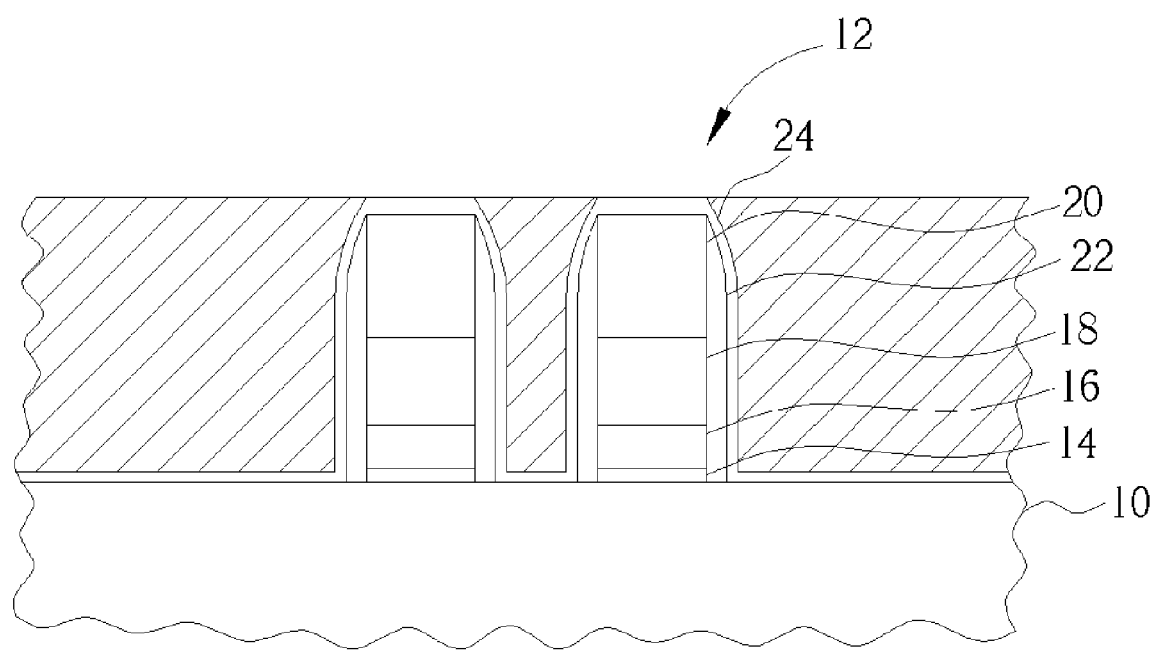
FIG. 3 to FIG. 5 are schematic diagrams showing the steps of forming a bit line.
Figure 4:
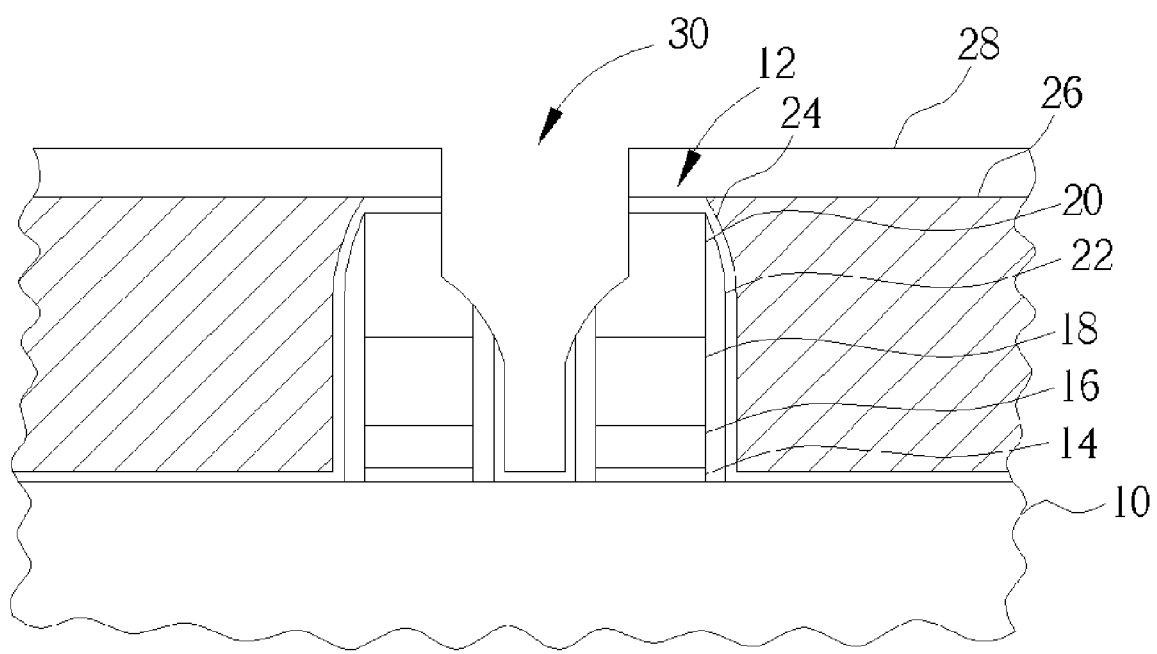
Figure 5:
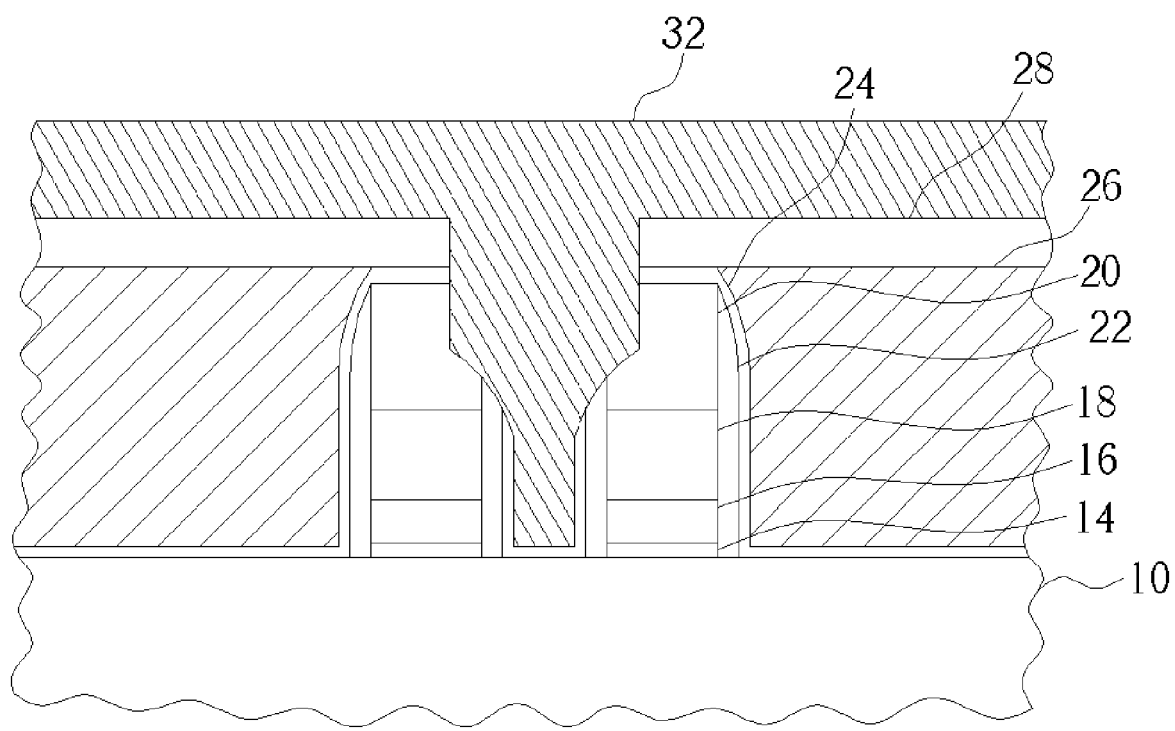
Figure 6:
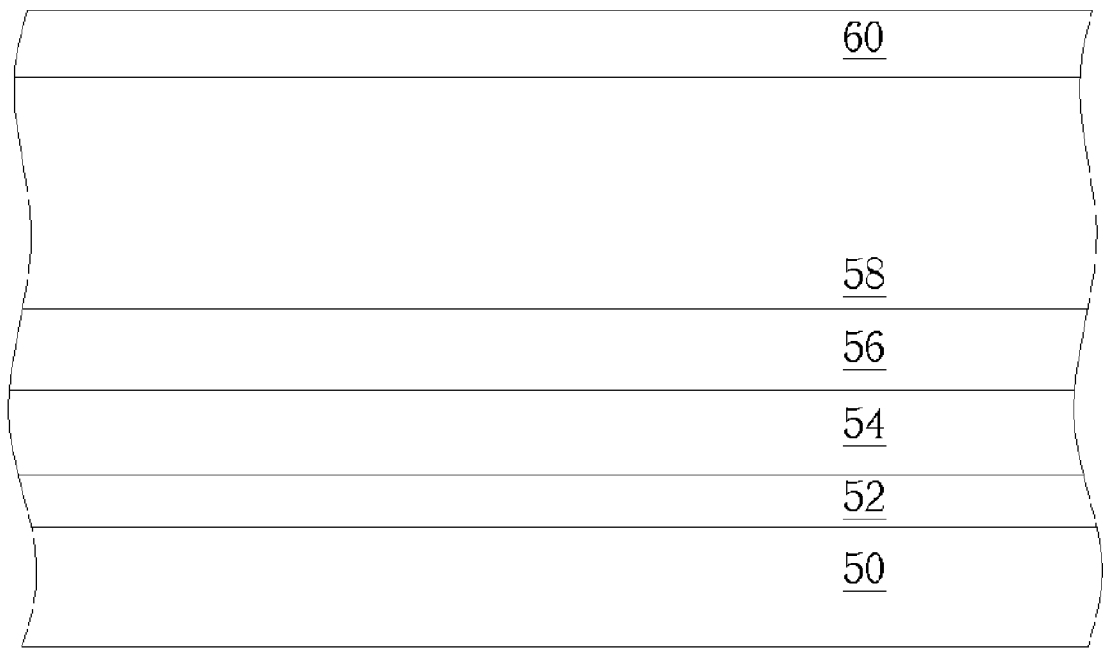
FIG. 6 to FIG. 10 are schematic diagrams showing a method of forming a gate structure according to the present invention.

Please refer to FIG. 6 to FIG. 10, which are schematic diagrams showing a method of forming a gate structure according to the present invention. As shown in FIG. 6, first, a substrate 50 is provided, and a gate oxide layer 52, a polysilicon layer 54, a silicide layer 56, a cap layer 58, and a silicon oxynitride layer 60 are consecutively formed on the substrate 50. It is worth noting that in this embodiment of the present invention, the polysilicon layer 54 is doped, and has a thickness of 800 Å. The silicide layer 56 is tungsten silicide, and has a thickness of 800 Å. And the cap layer 58 is silicon nitride, and has a thickness of 1600 Å. However, all the above-mentioned materials can be replaced by other materials having similar characteristics, and their thickness are adjustable according to different manufacturing requirements.

Figure 7:
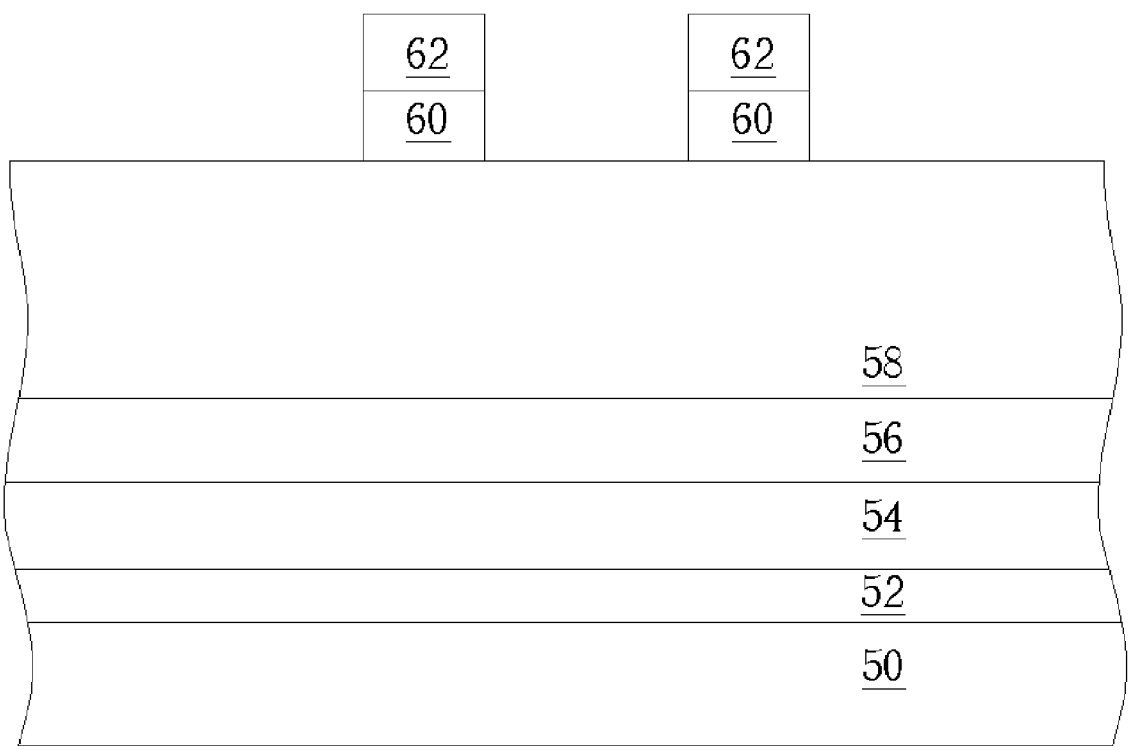

As shown in FIG. 7, a photoresist layer (not shown) is coated on the silicon oxynitride layer 60, and an exposure process and a development process are consecutively performed to remove a portion of the photoresist layer (not shown) for forming a photoresist pattern. Then the photoresist pattern 62 is utilized as a hard mask to etch the silicon oxynitride layer 60 not covered by the photoresist pattern 62.

Figure 8:
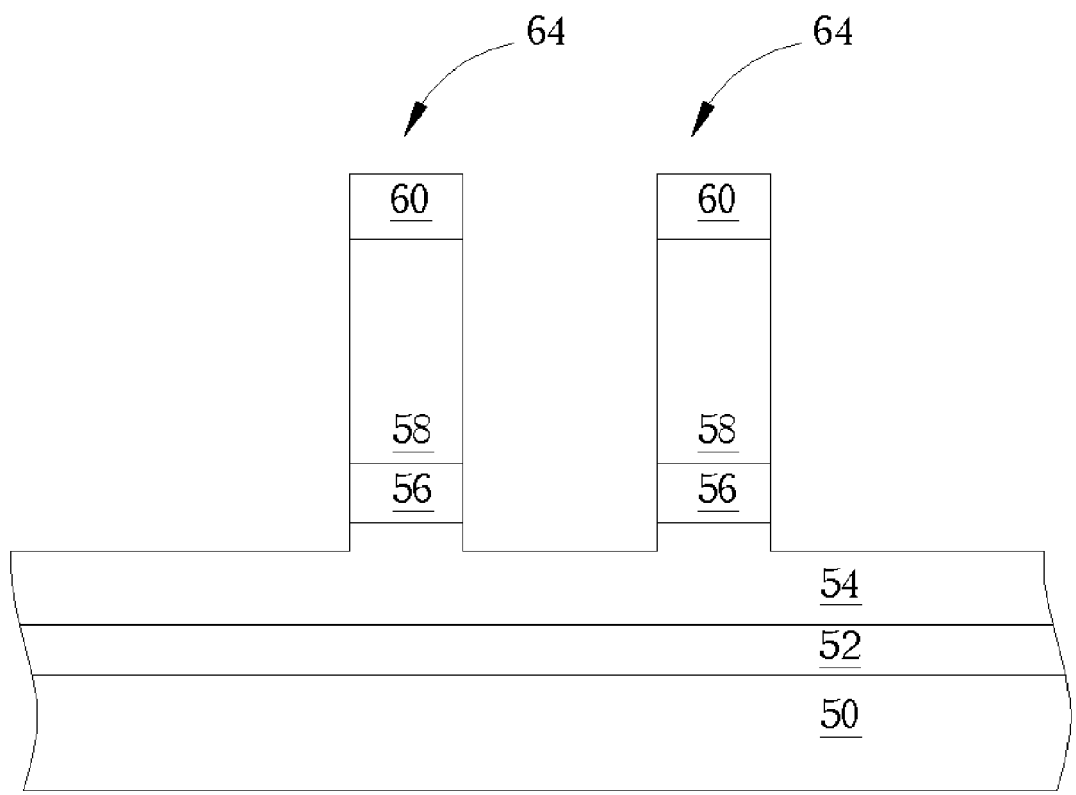

As shown in FIG. 8, first, the photoresist pattern 62 is removed. Then, the remaining silicon oxynitride layer 60 is utilized as a hard mask to etch the cap layer 58, the silicide layer 56, and a portion of the polysilicon layer 54 for forming a stacked gate structure 64.

Figure 9:
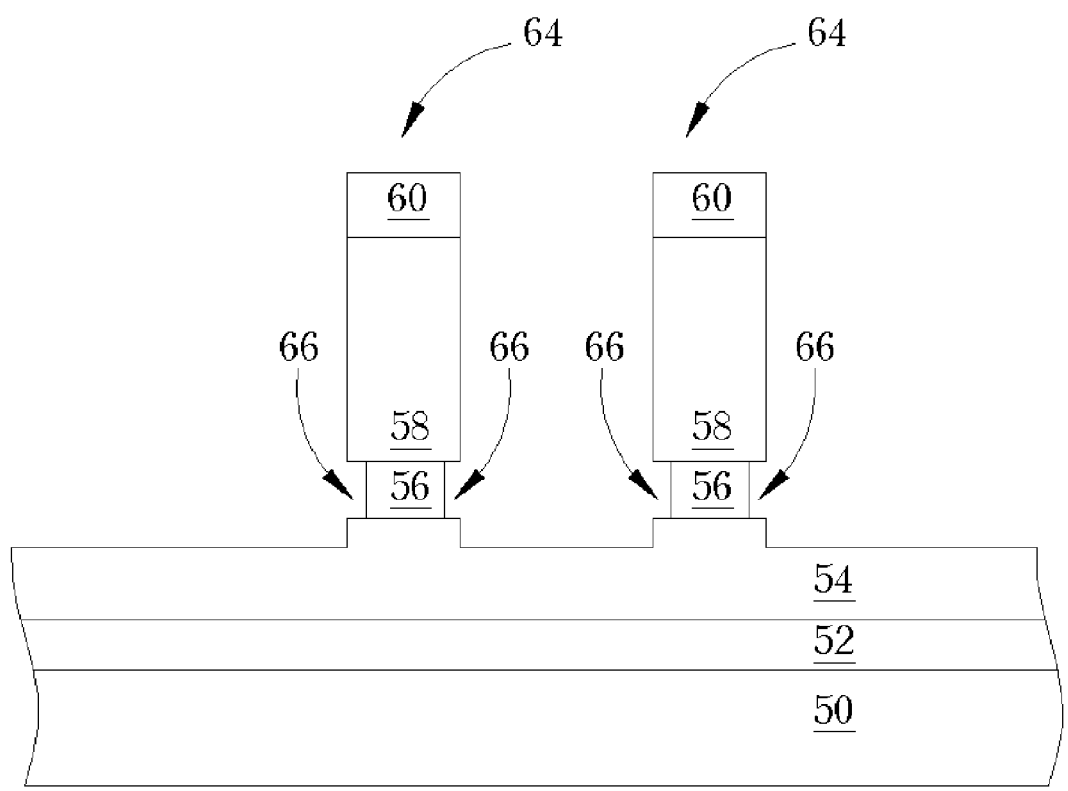

As shown in FIG. 9, an etching process is then performed by using an ammonium hydrogen peroxide mixture (APM) solution as an etching solution to remove the silicide layer 56 exposed on the sidewalls of the stacked gate structure 64 such that a recess 66 is formed. The volume ratio of the APM solution is $NH_4OH:H_2O_2:H_2O=1:1:5$ in this embodiment.

Figure 10:
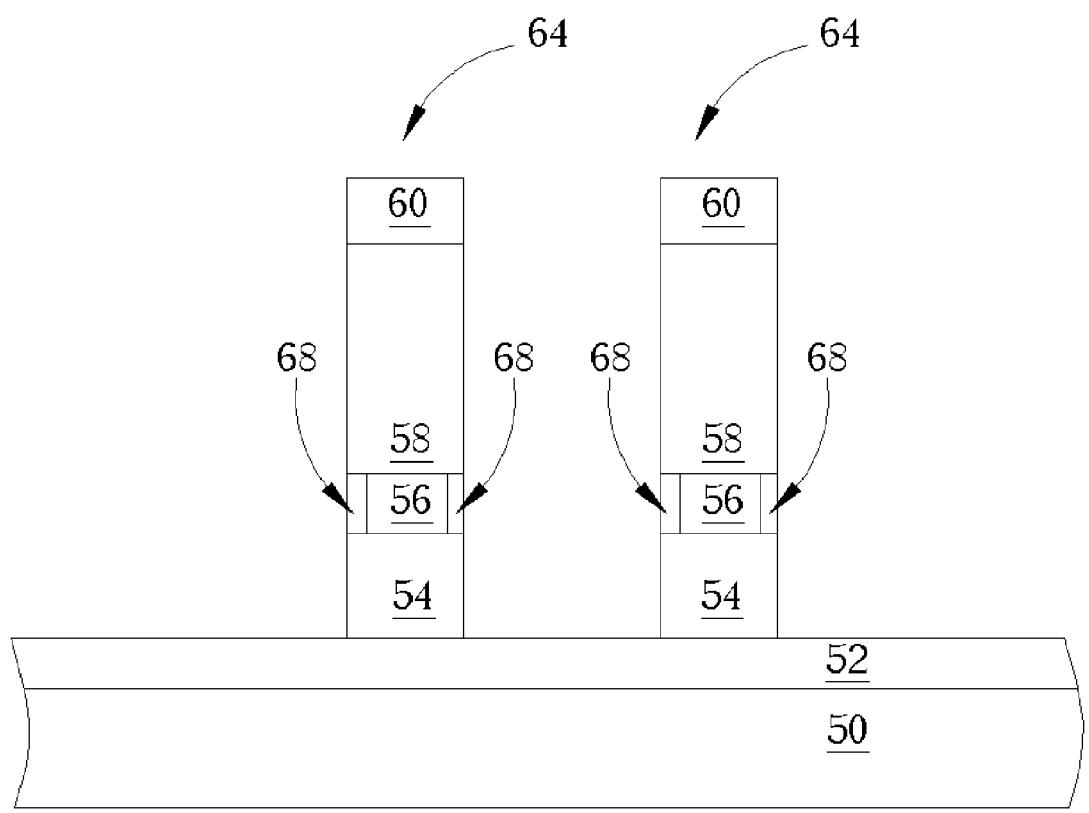

Finally as shown in FIG. 10, an etching process is carried out to remove the polysilicon layer 54 and the gate oxide layer 52 not covered by the silicon oxynitride layer 60. Then, a silicon nitride layer 68 is deposited to fill the recess 66. Following this, another etching process is performed to remove the silicon nitride layer 68 outside the recess 66 for accomplishing the stacked gate structure 64. It is worth noting that part of the polysilicon layer 54 is temporarily maintained when forming the recess 66 for protecting the gate oxide layer 52 from being damaged by the APM solution, which will cause the gate oxide layer 52 malfunction. In addition, the silicon nitride layer 68 filled into the recess 66 serves as a passivation layer for avoiding word line/bit line short-circuit in following processes.

As described in the prior art, steps of forming abit line are followed after the stacked gate structure 64 has to be implemented for forming a complete memory cell. However, since the steps of forming the bit line in the present invention are similar to the steps in the prior art, details are not given again here.

It is also worth noting that the silicon oxynitride layer 60 serves as a hard mask to form the stacked gate structure 64. Nevertheless, it is not the only way to form the stacked gate structure 64. The cap layer 58 can be also used as a hard mask to form the stacked gate structure 64.

In comparison with the prior art, the present invention forms a recess in the sidewalls of the stacked gate structure, and fills a passivation layer into the recess for avoiding word line/bit line short-circuit problem. In addition, to prevent the gate oxide layer from being eroded by the etching solution when forming the recess, a portion of the polysilicon layer alongside the sidewalls of the stacked gate structure is temporarily maintained and removed later.

Those skilled in the art will readily appreciate that numerous modifications and alterations of the device may be made without departing from the scope of the present invention. Accordingly, the above disclosure should be construed as limited only by the metes and bounds of the appended claims.

What is claimed is:

1. A method of forming a gate structure comprising:

providing a substrate, and consecutively forming a gate oxide layer, a polysilicon layer, a silicide layer, and a cap layer onto the substrate;

forming a patterned mask layer on the cap layer;

patterning the cap layer and the silicide layer to form a first stacked gate structure using the patterned mask layer as a mask;

removing a portion of the silicide layer exposed on sidewalls of the first stacked gate structure with an etching solution to form a recess;

depositing a passivation layer onto the polysilicon layer and filling the recess, and performing an anisotropic etching process to remove the passivation layer besides the passivation layer filed in the recess to form a second stacked gate structure;

removing the polysilicon layer and the gate oxide layer using the second stacked gate structure as a mask; and removing the patterned mask layer.

2. The method of claim 1 wherein the patterned mask layer comprises silicon oxynitride.

3. The method of claim 1 wherein the steps of forming the patterned mask layer comprises:

forming a silicon oxynitride layer on the cap layer;

coating a photoresist layer on the silicon oxynitride;

performing an exposure process and a development process by using a photo mask to form a photoresist pattern;

utilizing the photoresist pattern as a hard mask to remove the silicon oxynitride not covered by the photoresist pattern; and removing the photoresist pattern.

4. The method of claim 1 wherein the silicide layer comprises tungsten silicon.

5. The method of claim 1 wherein the etching solution is an ammonium hydrogen peroxide mixture (APM) solution.

6. The method of claim 1 wherein the passivation layer comprises silicon nitride.

* * * * *